(12) United States Patent
Wang et al.

(10) Patent No.: US 9,590,018 B2
(45) Date of Patent: Mar. 7, 2017

(54) ORGANIC LIGHT EMITTING DISPLAY DEVICE

(71) Applicant: Samsung Display Co., Ltd., Yongin (KR)

(72) Inventors: Seong Min Wang, Yongin-si (KR); Mu Gyeom Kim, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/743,075

(22) Filed: Jun. 18, 2015

(65) Prior Publication Data

US 2016/0204168 A1 Jul. 14, 2016

(30) Foreign Application Priority Data

Jan. 14, 2015 (KR) ........................ 10-2015-0007002

(51) Int. Cl.
*H01L 27/32* (2006.01)
*H01L 51/52* (2006.01)
*H01L 51/44* (2006.01)

(52) U.S. Cl.
CPC ........ *H01L 27/3227* (2013.01); *H01L 27/323* (2013.01); *H01L 51/441* (2013.01); *H01L 51/5271* (2013.01); *H01L 51/5281* (2013.01); *H01L 51/5284* (2013.01)

(58) Field of Classification Search
None
See application file for complete search history.

(56) References Cited

U.S. PATENT DOCUMENTS

| 7,038,373 | B2 * | 5/2006 | Arnold | H01L 51/529 |
| | | | | 313/503 |
| 8,368,654 | B2 | 2/2013 | Rosenblatt et al. | |
| 8,638,030 | B2 | 1/2014 | Lee et al. | |
| 8,730,179 | B2 | 5/2014 | Rosenblatt et al. | |
| 2004/0135499 | A1 * | 7/2004 | Cok | H01L 51/5284 |
| | | | | 313/506 |
| 2006/0250064 | A1 * | 11/2006 | Park | G02B 3/005 |
| | | | | 313/112 |
| 2008/0029147 | A1 * | 2/2008 | Yang | H01L 51/102 |
| | | | | 136/244 |
| 2012/0326131 | A1 | 12/2012 | Han | |
| 2013/0181241 | A1 * | 7/2013 | Meulen | H01L 51/52 |
| | | | | 257/98 |

(Continued)

FOREIGN PATENT DOCUMENTS

JP 2011-060608 3/2011
KR 10-1997-0014503 3/1997

(Continued)

*Primary Examiner* — Lex Malsawma
(74) *Attorney, Agent, or Firm* — H.C. Park & Associates, PLC (57) ABSTRACT

An organic light emitting display device including an organic light emitting element disposed on an insulation substrate, and an ambient light reflection preventing unit disposed on the organic light emitting element, the ambient light reflection preventing unit including a first metal layer, a first dielectric layer disposed on the first metal layer, the first metal layer and the first dielectric layer contacting each other, and a photovoltaic unit including the first metal layer as a first electrode.

19 Claims, 7 Drawing Sheets

(56) References Cited

U.S. PATENT DOCUMENTS

2015/0293560 A1* 10/2015 Choi .................... G06F 3/0412
345/174
2016/0149166 A1* 5/2016 Kwong ............... H01L 51/5293
257/40

FOREIGN PATENT DOCUMENTS

| | | |
|---|---|---|
| KR | 10-1998-077400 | 11/1998 |
| KR | 10-2002-0088488 | 11/2002 |
| KR | 10-2008-0083395 | 9/2008 |
| KR | 10-2009-0020726 | 2/2009 |
| KR | 10-2011-0049476 | 5/2011 |
| KR | 10-2011-0064410 | 6/2011 |
| KR | 10-2011-0070167 | 6/2011 |
| KR | 10-2012-0078959 | 7/2012 |
| KR | 10-2012-119852 | 10/2012 |

* cited by examiner

ORGANIC LIGHT EMITTING DISPLAY DEVICE

CROSS-REFERENCE TO RELATED APPLICATION

This application claims priority from and the benefit of Korean Patent Application No. 10-2015-0007002, filed on Jan. 14, 2015, which is hereby incorporated by reference for all purposes as if fully set forth herein.

BACKGROUND

Field

Exemplary embodiments of the present invention relate to an organic light emitting display device, and more particularly, to an organic light emitting display device including an ambient light reflection preventing unit integrally formed with a photovoltaic unit.

Discussion of the Background

An organic light emitting display device is a self-emissive display device including an organic light emitting diode (OLED). The an organic light emitting display device may have a wide angle of view, high contrast ratio, and a fast response speed compared to liquid crystal displays (LCD). However, the organic light emitting display device may have a low visibility in outdoor environment due to reflection of ambient light by a metal layer that may form the OLED. Accordingly, the organic light emitting display device may include a polarization element such as a circular polarizer to prevent reflection of ambient light, but the polarization element may be thick, which may increase manufacturing complexity of a flexible display.

Implementing a black thin film (BTF) in which a dielectric layer and a metal layer are alternately stacked has been discussed as a technique for replacing a circular polarizer.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments of the present invention provide an organic light emitting display device including an ambient light reflection preventing unit capable of photovoltaic generation.

Additional aspects will be set forth in the detailed description which follows, and, in part, will be apparent from the disclosure, or may be learned by practice of the inventive concept.

According to an exemplary embodiment of the present invention, an organic light emitting display device includes an organic light emitting element disposed on an insulation substrate, and an ambient light reflection preventing unit disposed on the organic light emitting element, the ambient light reflection preventing unit including a first metal layer, a first dielectric layer disposed on the first metal layer, the first metal layer and the first dielectric layer contacting each other, and a photovoltaic unit including the first metal layer as a first electrode.

The ambient light reflection preventing unit may further include a second dielectric layer, the first metal layer may be disposed between the second dielectric layer and the first dielectric layer, and the photovoltaic unit may include the second dielectric layer as a light receiving layer.

The ambient light reflection preventing unit may further include a second metal layer, the second dielectric layer may be disposed between the first metal layer and the second metal layer, and the photovoltaic unit may include the second metal layer as a second electrode.

The organic light emitting element may be disposed in a matrix form, and the second metal layer may be patterned to correspond to a non-display area, the non-display area not including the organic light emitting element.

The second metal layer may include a light blocking member.

The ambient light reflection preventing unit may further include a third dielectric layer, the second metal layer may be disposed between the second dielectric layer and the third dielectric layer.

The ambient light reflection preventing unit may further include a third metal layer, the third dielectric layer disposed between the second metal layer and the third metal layer, the third metal layer may include a first pattern including sensing electrodes, and the second metal layer may include a second pattern including bridge electrodes, the bridge electrodes connecting a first portion of the sensing electrodes to each other, and the second electrode of the photovoltaic unit may include the first portion of the sensing electrodes.

The third dielectric layer may include contact holes, and the bridge electrodes and the first portion of the sensing electrodes may be connected via the contact holes.

The first portion of the sensing electrodes may include one of transmitting electrodes Tx and receiving electrodes Rx, and a second portion of the sensing electrodes not comprising the first portion of the sensing electrodes may include the receiving electrodes Rx or the transmitting electrodes Tx to oppose the first portion of the sensing electrodes.

The ambient light reflection preventing unit may further include a third metal layer, the third dielectric layer may be disposed between the second metal layer and the third metal layer, a fourth metal layer, and a fourth dielectric layer may be disposed between the third metal layer and the fourth metal layer, the fourth metal layer may include a first pattern including sensing electrodes, and the third metal layer may include a second pattern including bridge electrodes connecting a first portion of the sensing electrodes to each other.

The fourth dielectric layer may include contact holes, and the bridge electrodes and the first portion of the sensing electrodes may be connected via the contact holes.

The insulation substrate may be flexible.

The third dielectric layer may be disposed between a transmitting electrode Tx and a receiving electrode Rx, the third dielectric layer insulating the transmitting and receiving electrodes Tx and Rx from each other.

According to an exemplary embodiment of the present invention, a method of forming an organic light emitting display device may include forming an organic light emitting element on an insulation substrate, forming a thin film encapsulation layer on the organic light emitting element, and forming an ambient light reflection preventing unit including a photovoltaic unit on the thin film encapsulation layer, in which forming the ambient light reflection layer includes sequentially forming a second metal layer, a second dielectric layer, a first metal layer, and a first dielectric layer on the thin film encapsulation layer, and the photovoltaic unit includes the second metal layer, the second dielectric layer, and the first metal layer.

The method may further include forming a light blocking member by patterning the second metal layer to correspond to a non-display area, the non-display area may not include the organic light element.

The method may further include forming a touch sensing unit in the photovoltaic unit, in which forming the touch sensing unit may include sequentially forming a third dielectric layer and a third metal layer between the second metal layer the second dielectric layer, patterning the third metal layer to form first sensing electrodes and second sensing electrodes, patterning the second metal layer to form bridge electrodes connecting the first sensing electrodes to each other, and patterning the third dielectric layer to form contact holes, the bridge electrodes and the first sensing electrodes may be connected via the contact holes.

The first sensing electrodes may be formed as one of transmitting electrodes Tx and receiving electrodes Rx, and the second sensing electrodes may be formed as the receiving electrodes Rx or the transmitting electrodes Tx to oppose the first sensing electrodes.

The method may further include forming a touch sensing unit, in which forming the touch sensing unit includes sequentially forming a fourth metal layer, a fourth dielectric layer, a third metal layer, and a third dielectric layer between the thin film encapsulation layer and the second metal layer, patterning the fourth metal layer to form first sensing electrodes and second sensing electrodes, patterning the third metal layer to form bridge electrodes connecting the first sensing electrodes to each other, and patterning the fourth dielectric layer to form contact holes, the bridge electrodes to the first sensing electrodes may be connected via the contact holes.

According to exemplary embodiments of the present invention, an organic light emitting display device including an ambient light reflection preventing unit capable of photovoltaic generation may be provided.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 1:
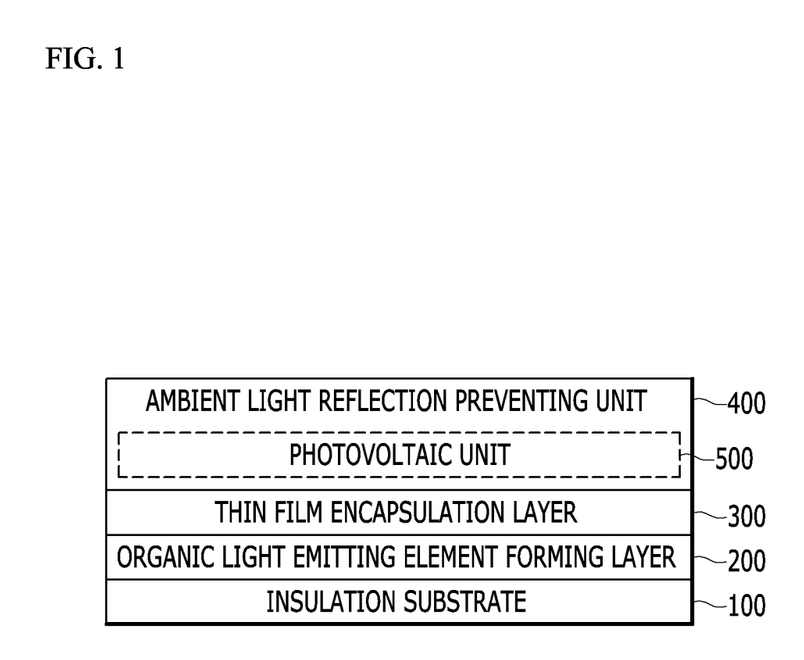
FIG. 1 illustrates a portion of a stacked structure of an organic light emitting display device according to an exemplary embodiment of the present invention.

FIG. 1 illustrates a portion of a stacked structure of an organic light emitting display device according to an exemplary embodiment of the present invention.

Referring to FIG. 1, the organic light emitting display device according to the present exemplary embodiment includes an insulation substrate 100, an organic light emitting element forming layer 200, a thin film encapsulation layer 300, an ambient light reflection preventing unit 400, and a photovoltaic unit 500.

The insulation substrate 100 may be formed of an insulating material, for example, a glass or a plastic such as polyimide. The insulation substrate 100 may be a flexible substrate.

The organic light emitting element forming layer 200 including organic light emitting elements 210a, 210b, and 210c (illustrated in FIGS. 3A and 3B) is formed on the insulation substrate 100.

The organic light emitting elements 210a, 210b, and 210c may include a cathode and an anode, and may further include a hole injection layer, a hole transport layer, an electron transport layer, an electron injection layer or the like between the cathode and the anode.

A thin-film transistor formed in the organic light emitting element forming layer 200 may be connected to the anode or the cathode of the organic light emitting elements 210a, 210b, and 210c. A driving transistor among the thin-film transistors may adjust a current applied to the organic light emitting elements 210a, 210b, and 210c based on a data voltage, to adjust a degree of light emission.

The thin film encapsulation layer 300 is formed on the organic light emitting element forming layer 200. Alternatively, the ambient light reflection preventing unit 400 may be configured to perform the function of the thin film encapsulation layer 300.

The thin film encapsulation layer 300 may prevent penetration of oxygen and moisture in the air into the organic light emitting elements 210a, 210b, and 210c. The thin film encapsulation layer 300 may have a structure of an inorganic layer and an organic layer that are alternately stacked. The number of alternation and the number of stacked layers may vary according to a display device to be manufactured.

An inorganic layer may prevent penetration of oxygen or moisture, and an organic layer may mitigate internal stress of the inorganic layer or may fill cracks in the inorganic layer.

The ambient light reflection preventing unit 400 is formed on the thin film encapsulation layer 300. The ambient light reflection preventing unit 400 may be formed by alternately stacking a dielectric layer and a metal layer. The ambient light reflection preventing unit 400 may be a black thin film (BTF). The ambient light reflection preventing unit 400 will be described in detail with reference to FIG. 2.

The photovoltaic unit 500 may be integrally formed with the ambient light reflection preventing unit 400. The photovoltaic unit 500 may be a solar cell element.

The photovoltaic unit 500 may have a stacked structure including a first electrode, a light receiving layer, and a second electrode.

Hereinafter, for convenience of description, a first electrode and a second electrode are respectively referred to as a cathode and an anode, but the first electrode and the second electrode may also correspond to an anode and a cathode, respectively.

The first electrode may be formed of a transparent conductive oxide (TCO) such as an indium tin oxide (ITO), and the second electrode may be formed of a material including a metal, such as molybdenum (Mo), a molybdenum oxide (MoOx), aluminum (Al), an aluminum alloy (AlNd), chromium (Cr), chromium oxide (CrOx), or the like. As will be described below, the first electrode and the second electrode may respectively correspond to a first metal layer 410 and a second metal layer 420. The type of metal may be selected in consideration of light transmittance and reflectivity.

A light receiving layer may vary according to a type of the photovoltaic unit 500, but may typically be formed of a semiconductor material. The semiconductor material may be formed of a dielectric material to form a second dielectric layer 460.

The light receiving layer may be formed of one of materials selected from a p-n junction semiconductor, polysilicon, amorphous silicon, copper indium gallium selenide (CIGS), and the like.

Figure 2:
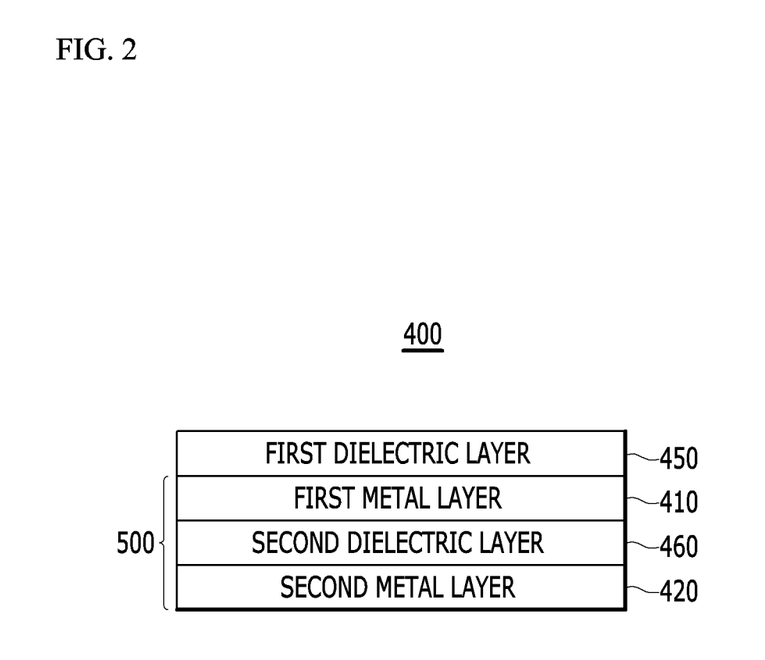
FIG. 2 illustrates a stacked structure of an ambient light reflection preventing unit according to an exemplary embodiment of the present invention.

FIG. 2 illustrates a stacked structure of an ambient light reflection preventing unit 400 according to an exemplary embodiment of the present invention.

Referring to FIG. 2, the ambient light reflection preventing unit 400 according to an exemplary embodiment of the present invention includes a second metal layer 420, a second dielectric layer 460, a first metal layer 410, and a first dielectric layer 450 stacked sequentially.

According to an exemplary embodiment of the present invention, the ambient light reflection preventing unit 400 may include two layers of a dielectric layer and a metal layer. Alternatively, the ambient light reflection preventing unit 400 may include more layers, for example, three, five, six layers or the like. The structure of the ambient light reflection preventing unit 400 may vary according to types of constituent materials of a metal layer and a dielectric layer, and a thickness of the dielectric layer, a configuration of an OLED, or the like.

The first metal layer 410 and the second metal layer 420 may be formed of a conductive material such as Ag, Au, Cu, Mg, W, Pt, or the like, in addition to the materials forming the first and second electrodes.

The first dielectric layer 450 and the second dielectric layer 460 may also be formed of a material such as silicon nitride (SiNx), silicon oxide (SiOx), zinc sulfide (ZnS), cadmium sulfide (CdS), silicon carbide (SiC), gallium phosphide (GaP), titanium oxide (TiOx), or the like, in addition to the materials forming the light receiving layer.

The ambient light reflection preventing unit 400 prevents reflection of ambient light by using destructive interference of light reflected on a metal layer. In addition, the metal layer, which has light absorbing properties, in the ambient light reflection preventing unit 400 may absorb ambient light that is not completely offset due to destructive interference. Accordingly, the ambient light reflection preventing unit 400 may replace a circular polarizing element, and thus it may be possible to manufacture a thin and flexible display device.

More particularly, by adjusting a relative phase between ambient light reflected by a metal layer of the ambient light reflection preventing unit 400, and ambient light reflected by a metal layer of the organic light emitting element forming layer 200 that includes the organic light emitting elements 210a, 210b, and 210c, to about 180 degrees, amplitudes of the ambient light are opposite to and may offset each other.

In order to adjust a relative phase, a thickness of a dielectric layer of the ambient light reflection preventing unit 400 may be adjusted. As adjusting a relative phase of reflected ambient light close to 180 degrees for all wavelengths of visible light using a single dielectric layer may be difficult, the ambient light reflection preventing unit 400 may include multiple dielectric layers.

Referring to FIG. 2, the first metal layer 410, the second dielectric layer 460, and the second metal layer 420 form the photovoltaic unit 500. The first metal layer 410 functions as the first electrode of the photovoltaic unit 500, the second dielectric layer 460 functions as the light receiving layer of the photovoltaic unit 500, and the second metal layer 420 functions as the second electrode of the photovoltaic unit 500.

Figure 3A:
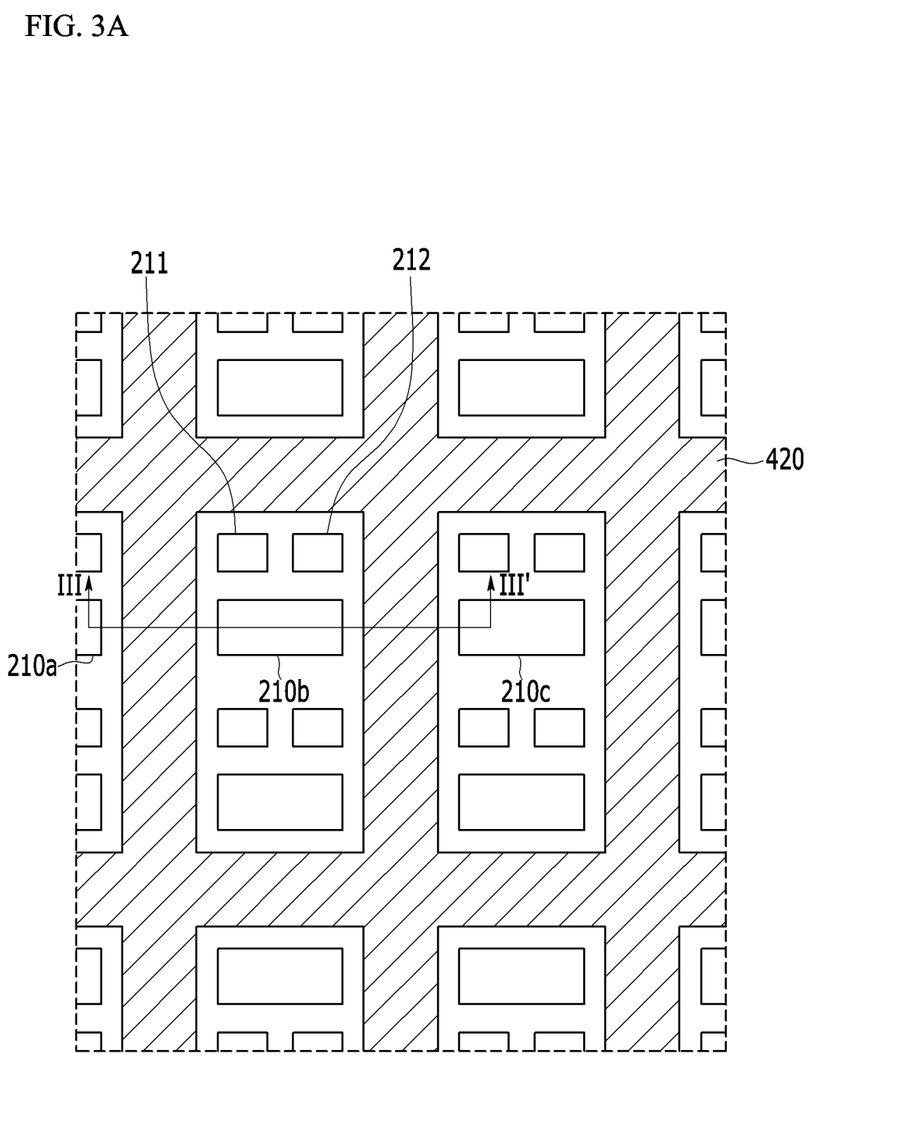
FIGS. 3A and 3B illustrate an organic light emitting display device according to an exemplary embodiment of the present invention.
Figure 3B:
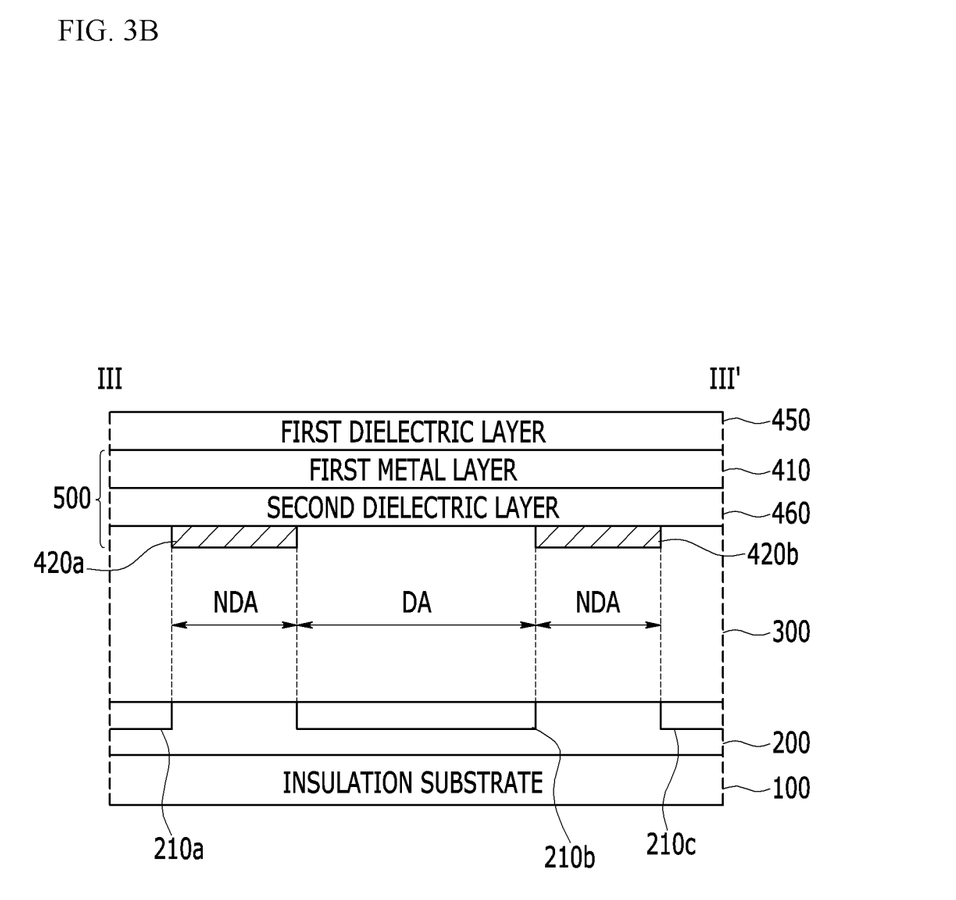

FIGS. 3A and 3B illustrate an organic light emitting display device according to an exemplary embodiment of the present invention.

FIG. 3A illustrates a portion of the organic light emitting display device according to the present exemplary embodiment, and FIG. 3B is a cross-sectional view of the portion of the organic light emitting display device taken along line III-III' of FIG. 3A.

In FIG. 3A, only the second metal layer 420 and the organic light emitting elements 210a, 210b, 210c, 211, and 212 are illustrated for convenience of description.

Referring to FIGS. 3A and 3B, the organic light emitting elements 210a, 210b, 210c, 211, and 212 are arranged in a matrix form.

The organic light emitting elements 210a, 210b, 210c, 211, and 212 may be formed of a material that includes colors or may include additional color filters. The organic light emitting elements 210a, 210b, 210c, 211, and 212 may be arranged in an S-stripe type, as illustrated in FIG. 3A. Alternatively, the organic light emitting elements 210a, 210b, 210c, 211, and 212 may be arranged in a RGB-stripe type where rectangles having the same sizes are sequentially arranged, a RGBW type where a W sub-pixel is further disposed, or a pentile type in which RG-GB configurations are repeatedly arranged, or the like.

An area where the organic light emitting elements 210a, 210b, 210c, 211, and 212 emit display light may be a display area DA. An area where light is not emitted or an area where a thin-film transistor, a contact hole, or the like are formed to block light may be a non-display area NDA.

The second metal layer 420 may be patterned to correspond to the non-display area NDA. A width of the second metal layer 420 may be equal to the width of the non-display area NDA or may be smaller or greater than the width of the non-display area NDA.

The second metal layer 420 may be patterned to be formed as light blocking members 420a and 420b. More particularly, the second metal layer 420 may include a metal having a high light reflectivity or a high light absorption ratio. The light blocking members 420a and 420b may perform the function of a black matrix. Accordingly, the ambient light reflection preventing unit 400 according to the present exemplary embodiment may prevent reflection of ambient light and self-emit using ambient light without additional configuration.

Referring to FIG. 3A, the second metal layer 420 is patterned to surround two dots, each dot formed of the organic light emitting elements 211, 212, and 210b of having three different colors. The second metal layer 420 may also be patterned to surround each dot or every three or more dots. Alternatively, the second metal layer 420 may be patterned to individually surround each of the organic light emitting elements 211, 212, and 210b.

The light blocking members 420a and 420b formed of the second metal layer 420 may be formed by patterning the second metal layer 420. A configuration of the light blocking members 420a and 420b may vary depending on a mask used in the manufacturing process of a display device and a resolution of the display device with respect to a display area.

Referring to FIG. 3B, the first dielectric layer 450 is an uppermost layer of the ambient light reflection preventing unit 400. A stacked structure including a metal layer and a dielectric layer may be further included on the first dielectric layer 450.

Figure 4A:
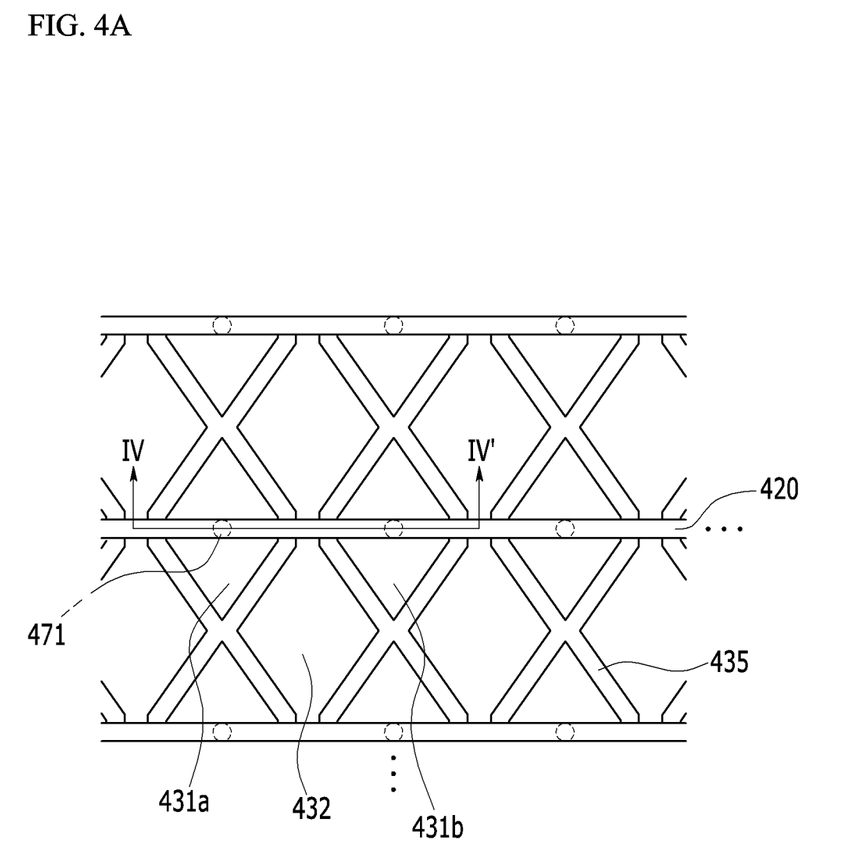
FIGS. 4A and 4B illustrate an organic light emitting display device according to an exemplary embodiment of the present invention.
Figure 4B:
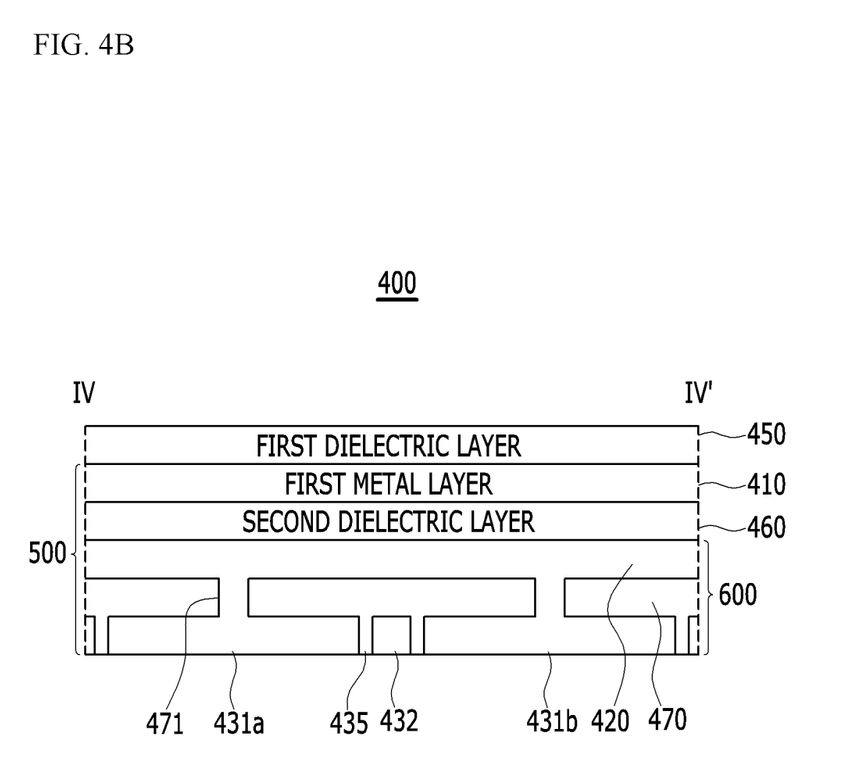

FIGS. 4A and 4B illustrate an organic light emitting display device according to an exemplary embodiment of the present invention.

FIG. 4A illustrates sensing electrodes formed by patterning the second metal layer 420 and a third metal layer, and FIG. 4B illustrates a cross-section of a portion of the organic light emitting display device taken along line IV-IV' of FIG. 4A.

Referring to FIGS. 4A and 4B, the ambient light reflection preventing unit 400 includes the photovoltaic unit 500 and a touch sensing unit 600 of an on-cell type.

A mutual capacitance method may be implemented as a method of sensing a touch of a user. Alternatively, a self-capacitance method may be implemented by varying a patterning structure of the second metal layer 420, the third metal layer, a third dielectric layer 470, and wiring structures connected to respective sensing electrodes.

The third metal layer is patterned to form the sensing electrodes 431a, 431b, and 432. The second metal layer 420 is patterned to form bridge electrodes that connect sensing electrodes 431a and 431b of the sensing electrodes to one another.

The sensing electrodes 431a and 431b of the sensing electrodes may be one of a transmitting electrode Tx and a receiving electrode Rx. Remaining sensing electrodes 432 of the sensing electrodes may be the receiving electrode Rx or the transmitting Tx.

The transmitting electrode Tx may receive a touch driving signal, and a readout circuit may be connected to the receiving electrode Rx electrode to detect a variation in capacitance between the transmitting electrode Tx and the receiving electrode Rx according to a touch of a user.

As described above, the second metal layer 420 is configured to correspond to the second electrode of the photovoltaic unit 500. According to an exemplary embodiment of the present invention, the second metal layer 420 is patterned to be electrically connected to the sensing electrodes 431a and 431b of the sensing electrodes as a bridge electrode, and thus, the sensing electrodes 431a and 431b of the sensing electrodes may also correspond to the second electrode of the photovoltaic unit 500.

Although the bridge electrode 420 is illustrated to have a bar shape connecting the sensing electrodes 431a and 431b of the sensing electrodes in FIG. 4A, the bridge electrode 420 may also be formed of a diamond pattern or the like, which is identical to a pattern of the sensing electrodes 431a and 431b of the sensing electrodes, or may have a plate shape.

The third dielectric layer 470 may have contact holes 471 so that the bridge electrode 420 is electrically connected to the sensing electrodes 431a and 431b of the sensing electrodes.

The third dielectric layer 470 may be configured to fill a gap 435 so that the transmitting electrode Tx and the receiving electrode Rx of the third metal layer are insulated from each other.

Ambient light may penetrate through the gap 435 that may cause light leakage. Accordingly, the light blocking member of FIG. 3A may be formed by considering the light leakage. More particularly, the third dielectric layer 470 may be formed, a trench may be patterned in the form of a sensing electrode, and then the third metal layer may be deposited.

When the second electrode layer 420 is patterned while not maintaining a plate shape, the second dielectric layer 460 and the third dielectric layer 470 may contact each other. The second dielectric layer 460 and the third dielectric layer 470 may be formed of the same material and at the same time in the same process. More particularly, the third dielectric layer 470 may also function as the light receiving layer of the photovoltaic unit 500.

According to an exemplary embodiment of the present invention, as the touch sensing unit 600 and the photovoltaic unit 500 share the second metal layer 420, the third dielectric layer 470, and the third metal layer, the touch sensing unit 600, and the photovoltaic unit 500 may be driven in a time-divisional manner according to each mode.

More particularly, while the touch sensing unit 600 functions, the photovoltaic unit 500 may be turned off, and when the touch sensing unit 600 does not function, the photovoltaic unit 500 may be turned on.

According to the present exemplary embodiment, by utilizing constituent layers of the ambient light reflection preventing unit 400, the functions of the photovoltaic unit 500 and the touch sensing unit 600 may be performed together.

Figure 5:
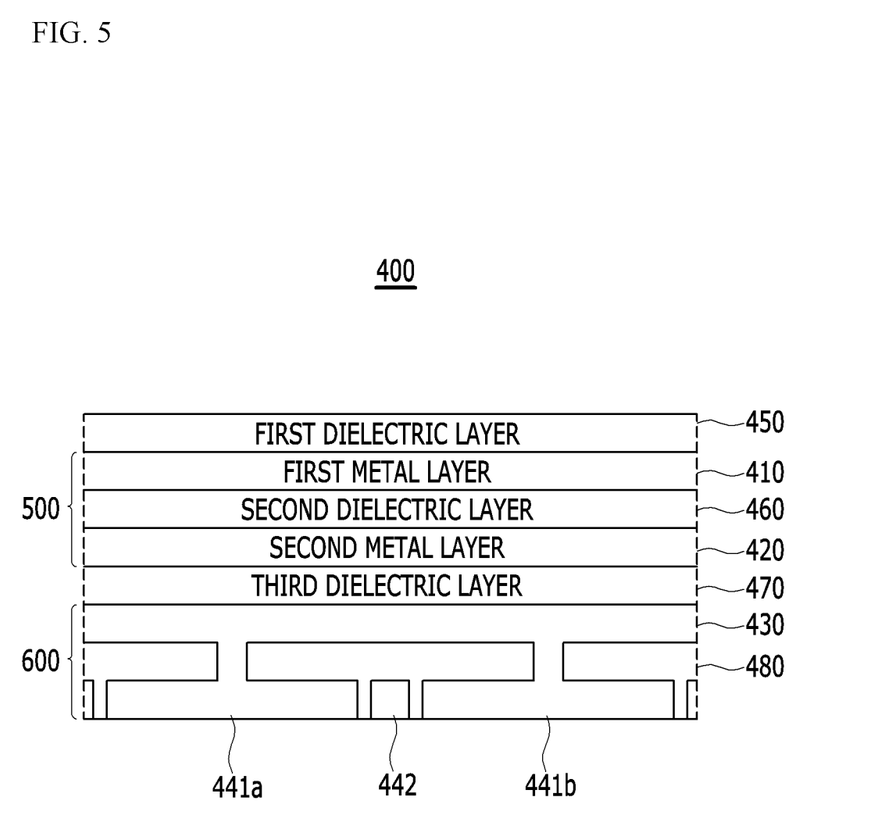
FIG. 5 illustrates an organic light emitting display device according to an exemplary embodiment of the present invention.

FIG. 5 illustrates an organic light emitting display device according to an exemplary embodiment of the present invention.

An ambient light reflection preventing unit illustrated in FIG. 5 further includes a fourth dielectric layer 480 and a fourth metal layer as compared to the ambient light reflection preventing unit illustrated with reference to FIGS. 4A and 4B.

In the ambient light reflection preventing unit 400 according to the present exemplary embodiment, a bridge electrode is formed in the third electrode layer 430, and sensing electrodes 441a, 441b, and 442 are formed in the fourth metal layer.

Accordingly, as the photovoltaic unit 500 and the touch sensing unit 600 are formed in separate layers from each other, the function of the photovoltaic unit 500 and the function of the touch sensing unit 600 may be simultaneously performed without having to be driven in a time-divisional manner.

As the fourth dielectric layer 480 and the fourth metal layer are further included, a thickness of a dielectric layer for destructive interference of ambient light may be determined more selectively.

Although certain exemplary embodiments and implementations have been described herein, other embodiments and modifications will be apparent from this description. Accordingly, the inventive concept is not limited to such exemplary embodiments, but rather to the broader scope of the presented claims and various obvious modifications and equivalent arrangements.

What is claimed is:

1. An organic light emitting display device, comprising:
   an organic light emitting element disposed on an insulation substrate; and
   an ambient light reflection preventing unit disposed on the organic light emitting element, the ambient light reflection preventing unit comprising:
   a first metal layer;
   a first dielectric layer disposed on the first metal layer, the first metal layer and the first dielectric layer contacting each other; and
   a photovoltaic unit comprising the first metal layer as a first electrode.

2. The organic light emitting display device of claim 1, wherein:
   the ambient light reflection preventing unit further comprises a second dielectric layer;
   the first metal layer is disposed between the first dielectric layer and the second dielectric layer; and
   the photovoltaic unit comprises the second dielectric layer as a light receiving layer.

3. The organic light emitting display device of claim 2, wherein:
   the ambient light reflection preventing unit further comprises a second metal layer;
   the second dielectric layer is disposed between the first metal layer and the second metal layer; and
   the photovoltaic unit comprises the second metal layer as a second electrode.

4. The organic light emitting display device of claim 3, wherein:
   the organic light emitting element is disposed in a matrix form; and
   the second metal layer is patterned to correspond to a non-display area, the non-display area not comprising the organic light emitting element.

5. The organic light emitting display device of claim 4, wherein the second metal layer comprises a light blocking member.

6. The organic light emitting display device of claim 3, wherein:
   the ambient light reflection preventing unit further comprises a third dielectric layer; and
   the second metal layer is disposed between the second dielectric layer and the third dielectric layer.

7. The organic light emitting display device of claim 6, wherein:
   the ambient light reflection preventing unit further comprises a third metal layer;

the third dielectric layer is disposed between the second metal layer and the third metal layer;

the third metal layer comprises a first pattern comprising sensing electrodes;

the second metal layer comprises a second pattern comprising bridge electrodes, the bridge electrodes connecting a first portion of the sensing electrodes to each other; and the second electrode of the photovoltaic unit comprises the first portion of the sensing electrodes.

8. The organic light emitting display device of claim 7, wherein:

the third dielectric layer comprises contact holes; and the bridge electrodes and the first portion of the sensing electrodes are connected via the contact holes.

9. The organic light emitting display device of claim 8, wherein:

the first portion of the sensing electrodes comprise one of transmitting electrodes Tx and receiving electrodes Rx; and a second portion of the sensing electrodes not comprising the first portion of the sensing electrodes comprise the receiving electrodes Rx or the transmitting electrodes Tx to oppose to the first portion of the sensing electrodes.

10. The organic light emitting display device of claim 6, wherein:

the ambient light reflection preventing unit further comprises:

a third metal layer, the third dielectric layer disposed between the second metal layer and the third metal layer;

a fourth metal layer; and a fourth dielectric layer disposed between the third metal layer and the fourth metal layer;

the fourth metal layer comprises a first pattern comprising sensing electrodes; and the third metal layer comprises a second pattern comprising bridge electrodes connecting a first portion of the sensing electrodes to each other.

11. The organic light emitting display device of claim 10, wherein:

the fourth dielectric layer comprises contact holes; and the bridge electrodes and the first portion of the sensing electrodes are connected via the contact holes.

12. The organic light emitting display device of claim 1, wherein the insulation substrate is flexible.

13. The organic light emitting display device of claim 9, wherein the third dielectric layer is disposed between a transmitting electrode Tx and a receiving electrode Rx, the third dielectric layer insulating the transmitting and receiving electrodes Tx and Rx from each other.

14. A method of forming an organic light emitting display device, the method comprising:

forming an organic light emitting element on an insulation substrate;

forming a thin film encapsulation layer on the organic light emitting element; and forming an ambient light reflection preventing unit comprising a photovoltaic unit on the thin film encapsulation layer, wherein:

forming the ambient light reflection preventing unit comprises sequentially forming a second metal layer, a second dielectric layer, a first metal layer, and a first dielectric layer on the thin film encapsulation layer; and the photovoltaic unit comprises the second metal layer, the second dielectric layer, and the first metal layer.

15. The method of claim 14, further comprising forming a light blocking member by patterning the second metal layer to correspond to a non-display area, the non-display area not comprising the organic light emitting element.

16. The method of claim 14, further comprising forming a touch sensing unit in the photovoltaic unit, wherein forming the touch sensing unit comprises:

sequentially forming a third dielectric layer and a third metal layer between the second metal layer the second dielectric layer;

patterning the third metal layer to form first sensing electrodes and second sensing electrodes;

patterning the second metal layer to form bridge electrodes connecting the first sensing electrodes to each other; and patterning the third dielectric layer to form contact holes, the bridge electrodes to the first sensing electrodes are connected via the contact holes.

17. The method of claim 16, wherein:

the first sensing electrodes are formed as one of transmitting electrodes Tx and receiving electrodes Rx; and the second sensing electrodes are formed as the receiving electrodes Rx or the transmitting electrodes Tx to oppose the first sensing electrodes.

18. The method of claim 14, further comprising forming a touch sensing unit, wherein forming the touch sensing unit comprises:

sequentially forming a fourth metal layer, a fourth dielectric layer, a third metal layer, and a third dielectric layer between the thin film encapsulation layer and the second metal layer;

patterning the fourth metal layer to form first sensing electrodes and second sensing electrodes;

patterning the third metal layer to form bridge electrodes connecting the first sensing electrodes to each other; and patterning the fourth dielectric layer to form contact holes, the bridge electrodes to the first sensing electrodes are connected via the contact holes.

19. The method of claim 18, wherein:

the first sensing electrodes are formed as one of transmitting electrodes Tx and receiving electrodes Rx; and the second sensing electrodes are formed as the receiving electrodes Rx or the transmitting electrodes Tx to oppose the first sensing electrodes.

* * * * *